United States Patent
Fang

[19]

[11] Patent Number: 6,084,779
[45] Date of Patent: Jul. 4, 2000

[54] GROUND AND POWER PATCHES ON PRINTED CIRCUIT BOARD SIGNAL PLANES IN THE AREAS OF INTEGRATED CIRCUIT CHIPS

[75] Inventor: Jiayuan Fang, Binghamton, N.Y.

[73] Assignee: Sigrity, Inc., San Jose, Calif.

[21] Appl. No.: 09/165,382

[22] Filed: Oct. 2, 1998

[51] Int. Cl.⁷ .................................................... H05K 1/18
[52] U.S. Cl. .......................... 361/763; 361/764; 361/748; 361/734; 361/794; 257/774; 257/782; 257/758; 257/773; 174/255; 174/260; 174/266
[58] Field of Search .................................. 361/763, 794, 361/734, 764, 728, 748; 257/774, 782, 758, 750, 762, 773; 174/255, 258, 260, 266

[56] References Cited

U.S. PATENT DOCUMENTS

| | | | |
|---|---|---|---|
| 4,626,958 | 12/1986 | Lockard et al. | 361/306.1 |
| 5,012,047 | 4/1991 | Dohya | 174/250 |
| 5,239,448 | 8/1993 | Perkins et al. | 361/724 |
| 5,557,502 | 9/1996 | Banerjee et al. | 361/712 |
| 5,623,160 | 4/1997 | Liberkkowski | 257/621 |
| 5,719,750 | 2/1998 | Iwane | 361/794 |
| 5,744,758 | 4/1998 | Takenouche et al. | 174/255 |
| 5,847,936 | 12/1998 | Forehand et al. | 361/794 |
| 5,926,377 | 7/1999 | Nakao et al. | 361/763 |

*Primary Examiner*—Leo P. Picard
*Assistant Examiner*—David Foster
*Attorney, Agent, or Firm*—Salzman & Levy

[57] ABSTRACT

The present invention is a multi-level printed circuit board (PCB) containing at least one power plane for conducting and distributing electrical power and at least one ground plane, spaced apart from the power plane, for providing and distributing an electrical ground. At least one integrated circuit chip is mounted on the printed circuit board. At least one signal plane is spaced apart from both the power plane and the ground plane, for conducting and distributing electrical signals from a first point to a second point. The signal plane(s) each have a portion or "patch" that is electrically isolated from signal traces in the remainder of the signal plane. The patches are placed in the area underneath the integrated circuit chip. The patches are connected, respectively, to the power plane or to the ground plane, for reducing effective inductance and input impedance. The multi-level PCB has one or more plated through hole vias for connecting the power or ground plane to a patch. Decoupling capacitors may be provided between the sets of plated through hole vias to further reduce input impedance.

20 Claims, 17 Drawing Sheets

GROUND AND POWER PATCHES ON PRINTED CIRCUIT BOARD SIGNAL PLANES IN THE AREAS OF INTEGRATED CIRCUIT CHIPS

FIELD OF THE INVENTION

The present invention relates to multi-level printed circuit boards (PCBs) and, more particularly, to a multi-level PCB having a power plane and a ground plane and a spaced apart signal plane having a patch electrically isolated from signal traces in the remainder of the signal plane, operatively connected to the power plane or the ground plane.

BACKGROUND OF THE INVENTION

Certain complex problems may have optimum, but not perfect solutions. This apothegm seems to be particularly true in the field of multi-level printed circuit board design. Factors such as power, resistance, impedance, inductance and efficiency must be taken into consideration in every sophisticated PCB design. Often, one characteristic is improved at the expense of one or more other parameters.

In order to maximize 3-dimensional space available for circuitry, multi-layer PCBs have been used for many years. While ever greater sophistication in circuitry is desired and reflected in the signal planes of the board, it is well known that power and grounding considerations are also important.

In typical printed circuit boards, signal planes are sandwiched between power and ground planes. It has been found that undesirable electrical effects occur when too much distance separates power (voltage) planes from ground planes. These effects may be manifested, for example, in unacceptable delta-I switching noise, higher than acceptable input impedance, and unacceptable effective inductance.

Conventionally, one solution to this problem has been to provide additional power planes and ground planes in multi-layer PCBs. Voltage and/or ground planes will be referred to as "service" planes. It is not unusual, in fact, to find that power and ground planes outnumber signal planes in certain structures. The adverse consequence of adding power and ground planes is the increase of the manufacturing cost. Another solution is to reduce the separation between power and ground planes. But the requirement on the characteristic impedance of signal traces, which are typically placed between the power and ground planes, mandates that the separation between the power and ground planes cannot be smaller than a certain limit.

After the layout of signal traces on signal plane layers, signal plane layers are typically not fully populated, especially near the edges and corners of signal plane layers. The spare spaces on signal plane layers are sometimes utilized to place power and ground conductors. The power and ground conductors placed on the spare spaces on signal plane layers reduce the effective distance between the power distribution system and the ground distribution system, and therefore reduce the effective inductance of the power and ground supply systems. However, since the spare spaces on signal plane layers are typically near edges and corners, which are relatively far away from integrated circuit chips mounted on printed circuit boards, power and ground conductors placed on these spare spaces may not have significant effect on the improvement of the power and ground supply to integrated circuit chips.

Since the power and ground supply noise is mainly due to fast switching currents of integrated circuit devices inside integrated circuit chips, the power and ground supply noise in a printed circuit board is mainly originated from the area on which the integrated circuit chip is mounted. Therefore, the most critical area in a printed circuit board is the area on which the integrated circuit chip is mounted. Instead of placing power and ground conductors in spare spaces on the signal plane layers after the layout is completed, it would be of advantage to purposely detour the routing of signal traces to allow the placement of power and ground patches in the area right underneath the integrated circuit chips.

SUMMARY OF THE INVENTION

In accordance with the present invention, there is provided a multi-level printed circuit board containing at least one power plane for conducting and distributing electrical power and at least one ground plane, spaced apart from the power plane, for providing and distributing an electrical ground. At least one signal plane is spaced apart from both the power plane and the ground plane, for conducting and distributing electrical signals from a first point to a second point. At least one integrated circuit chip is mounted on the printed circuit board. The signal plane(s) may have an electrically conductive portion or "patch" that is electrically isolated from signal traces in the remainder of the signal plane. The patches are in the area underneath the integrated circuit chip. The patches may be selectively connected to a power plane or to a ground plane, for reducing effective inductance and input impedance of the power and ground supplies.

The multi-level printed circuit board has one or more plated through hole vias for connecting a ground plane to one or more patches and one or more plated through hole vias for connecting a power plane to other patches on either the same signal plane or on another signal plane. Decoupling capacitors may be provided between the sets of plated through hole vias to further reduce the power and ground supply effective inductance.

BRIEF DESCRIPTION OF THE DRAWINGS

A complete understanding of the present invention may be obtained by reference to the accompanying drawings, when taken in conjunction with the detailed description thereof and in which:

FIG. 1b is a schematic cross sectional view of the PCB shown in FIG. 1a.

FIG. 2b is a schematic cross sectional view of the PCB shown in FIG. 2a.

FIG. 3b is a schematic cross sectional view of the PCB shown in FIG. 3a.

FIG. 4b is a schematic cross sectional view of the PCB shown in FIG. 4a.

FIG. 5b is a schematic cross sectional view of the PCB shown in FIG. 5a.

FIG. 7 is a graphical representation of the effective inductance vs. frequency for the structure shown in FIGS. 2a, 3a and 4a.

FIG. 8 is a graphical representation of the effective inductance vs. frequency for the structure shown in FIG. 5a.

For purposes of clarity and brevity, like elements and components will bear the same designations throughout the FIGURES.

DESCRIPTION OF THE PREFERRED EMBODIMENT

Briefly stated, the present invention is a multi-level printed circuit board containing at least one power plane for conducting and distributing electrical power and at least one ground plane, spaced apart from the power plane, for providing and distributing an electrical ground. At least one signal plane is spaced apart from both the power plane and the ground plane, for conducting and distributing electrical signals from a first point to a second point by means of signal traces. The signal plane(s) may have an electrically conductive portion or "patch" that is electrically isolated from signal traces in the remainder of the signal plane. The patches are placed in the area where an integrated circuit chip is mounted on the top or bottom mounting layer. The patches are connected, respectively, to the power planes and/or to the ground planes, for reducing effective inductance and input impedance.

The multi-level PCB has one or more plated through hole vias for connecting a ground plane to one patch and one or more plated through hole vias for connecting a power plane to another patch. Decoupling capacitors may be provided between the sets of plated through hole vias to further reduce input impedance.

Figure 1A:
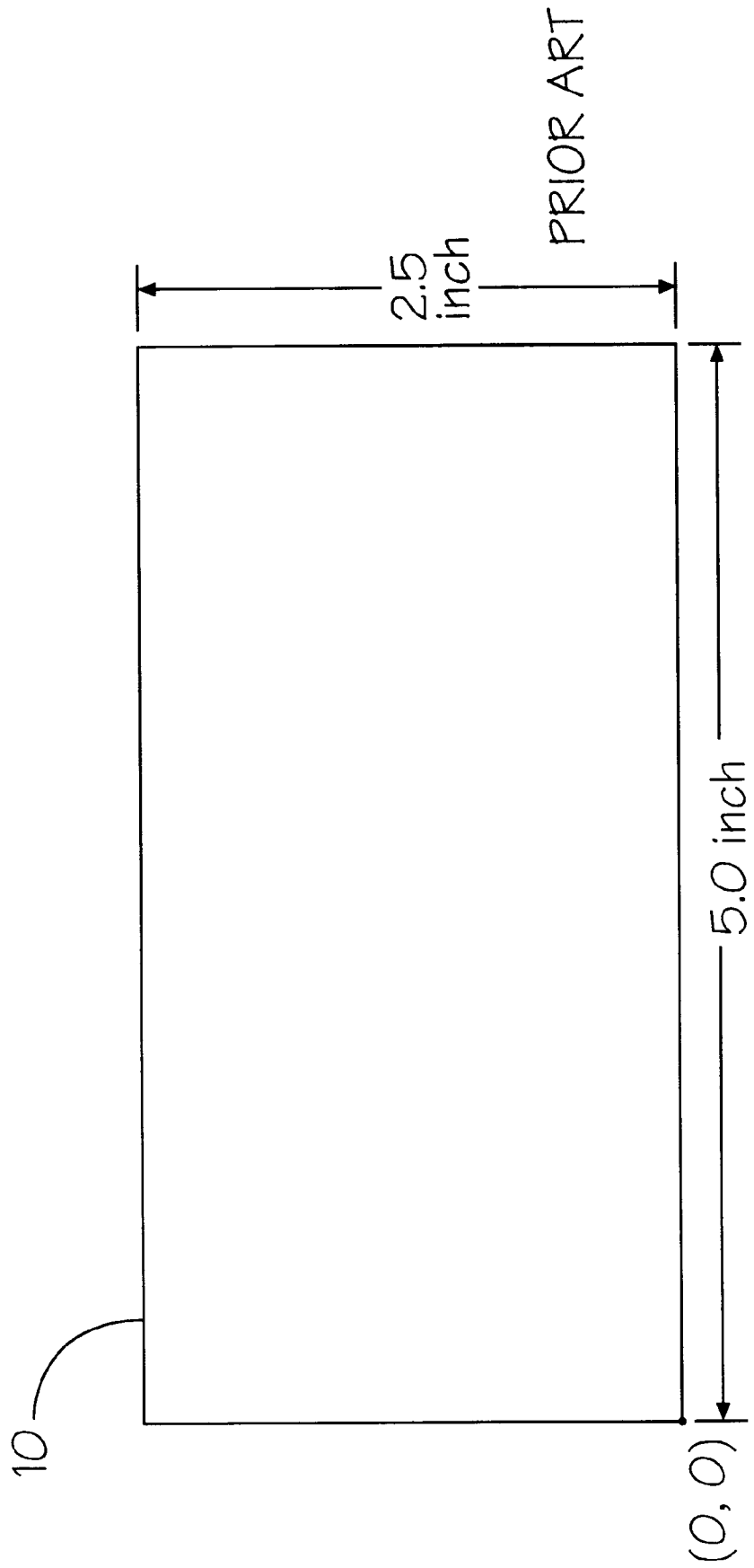
FIG. 1a is a schematic top view of a multi-level printed circuit board, well known in the prior art.
Figure 1B:
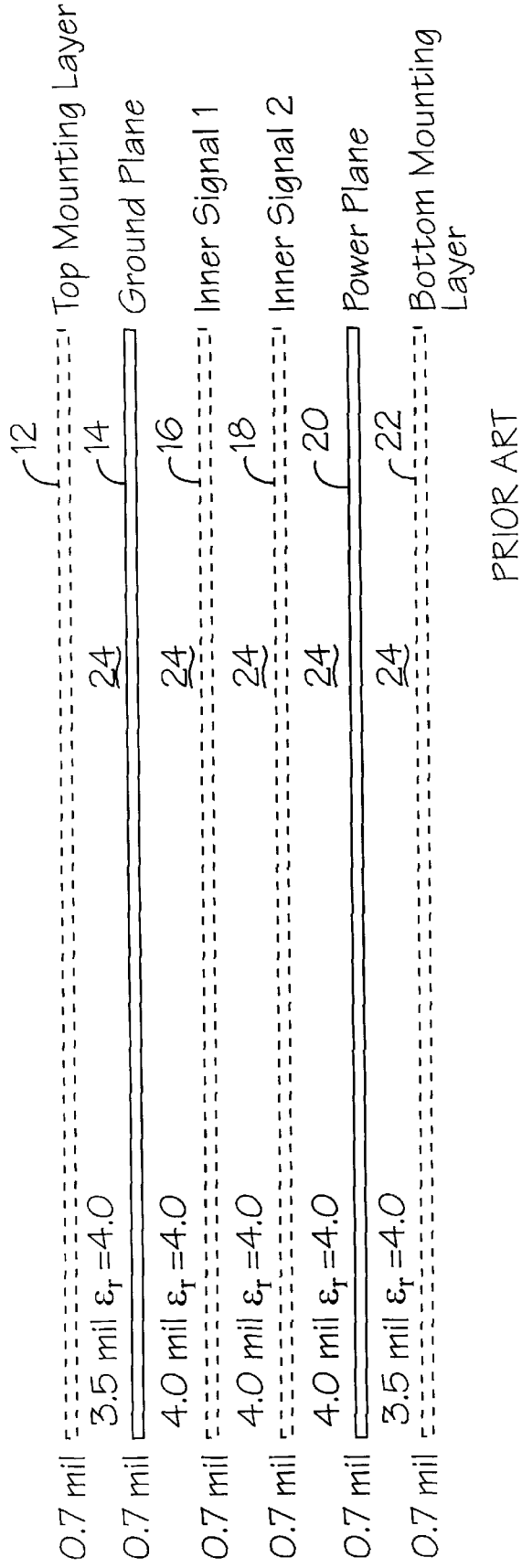

Referring now to FIGS. 1a and 1b, there is shown a schematic top view of a typical, unpopulated, prior art PCB 10. The board has an upper or top signal mounting plane or layer 12, a ground plane 14, two signal planes, labeled "Inner Signal 1" and "Inner Signal 2" and referred to as reference numerals 16 and 18, respectively, a power (voltage) plane 20, and a lower or bottom signal mounting plane or layer 22. All layers 12–22 are copper.

For purposes of simulations conducted by the applicant, the overall dimensions of the board 10 are 5"×2.5" and each layer 12–22 is 0.7 mil thick. The distance between layers is 4.0 mils, except for the distance between top and bottom mounting layers 12 and 22, respectively, and the rest of the structure, which is 3.5 mils.

A suitable dielectric material 24 is used to fill the spaces between layers or planes 12–22. The material has electrical conductivity of 0.001 S/m and relative permeability of 4.

Figure 2A:
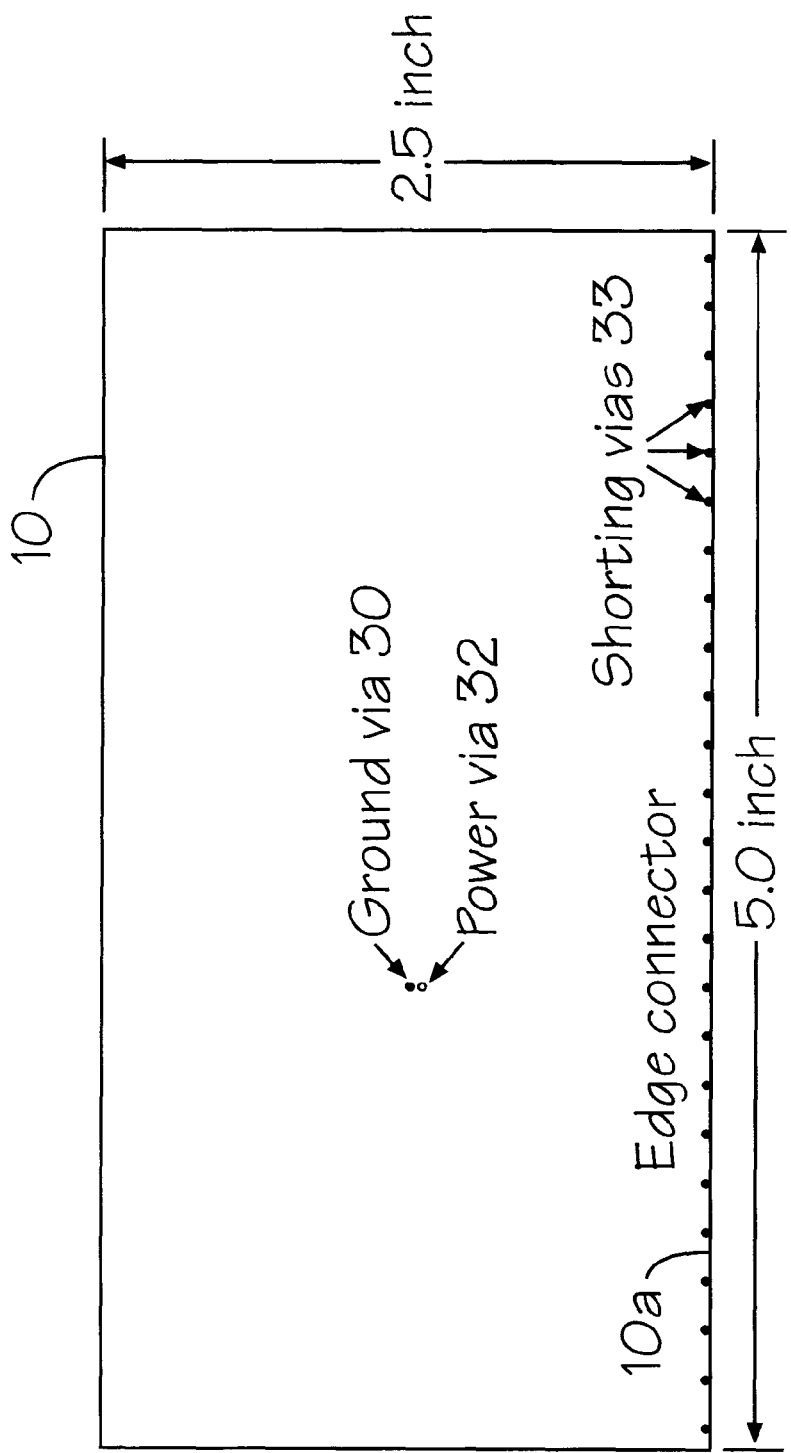
FIG. 2a is a schematic top view of a multi-level PCB, including a ground plane, a power plane, and respective plated through hole vias.
Figure 2B:
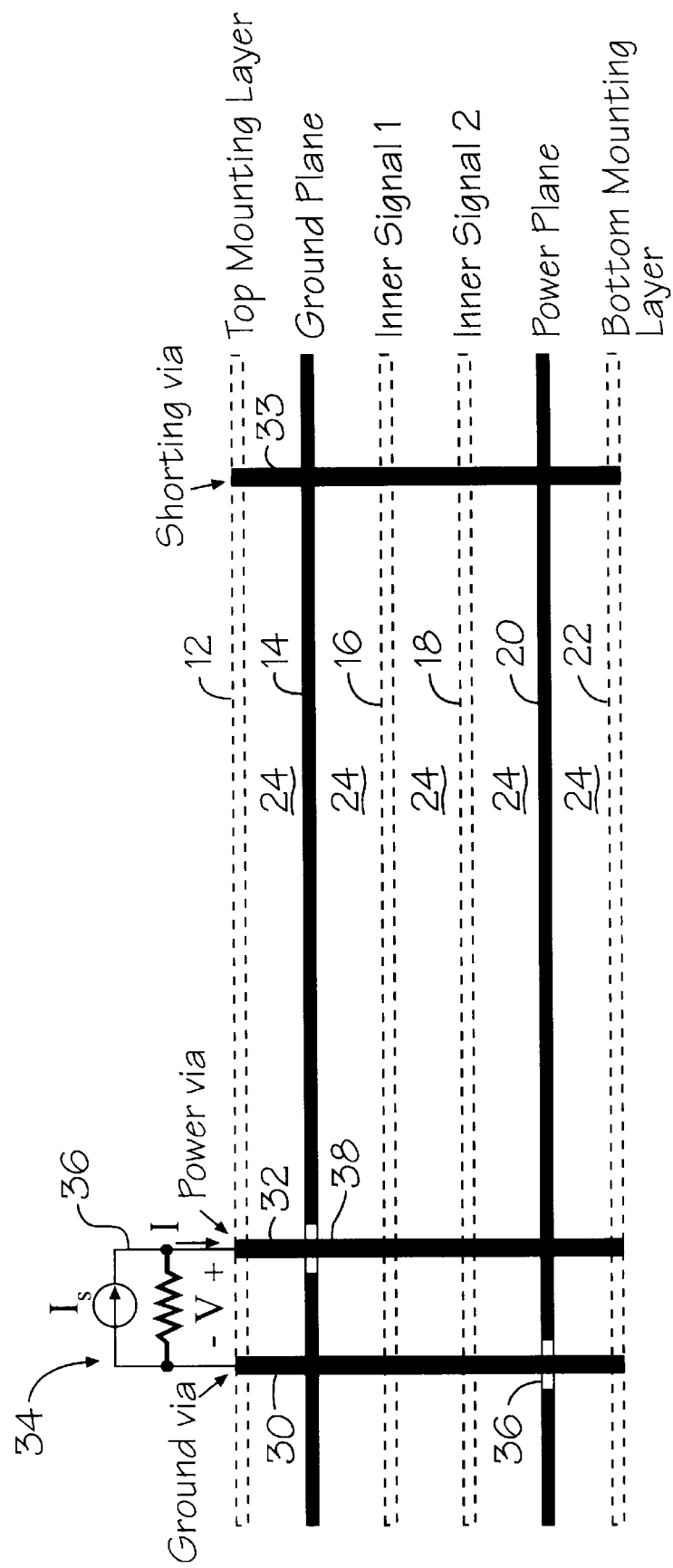

Referring now to FIGS. 2a and 2b, there is shown a PCB 10 similar to that shown in FIGS. 1a and 1b, but also including a plated through hole via for ground 30 and a plated through hole via for power 32. Vias 30 and 32 are disposed in the core area of an IC chip, not shown, placed on PCB board 10. Each via 30 and 32 has an 8 mil diameter. In a 6×6 array of alternating power and ground vias, the separation between adjacent plated through hole vias is 50 mils. An edge connector and shorting vias are shown, respectively, at reference numerals 10a and 33. The effect of the edge connector 10a is modeled by 25 printed through hole shorting vias 33 along the bottom row of the PCB card 10.

As can be seen in FIG. 2b, the ground via 30 is connected to a circuit 34 and ground plane 14; and the power via 32 is connected to a circuit 34 and power plane 20. Ground via 30 is not connected to power plane 20 as shown at reference numeral 36, nor is power via 32 connected to ground plane 14, as shown at reference numeral 38.

Figure 3A:
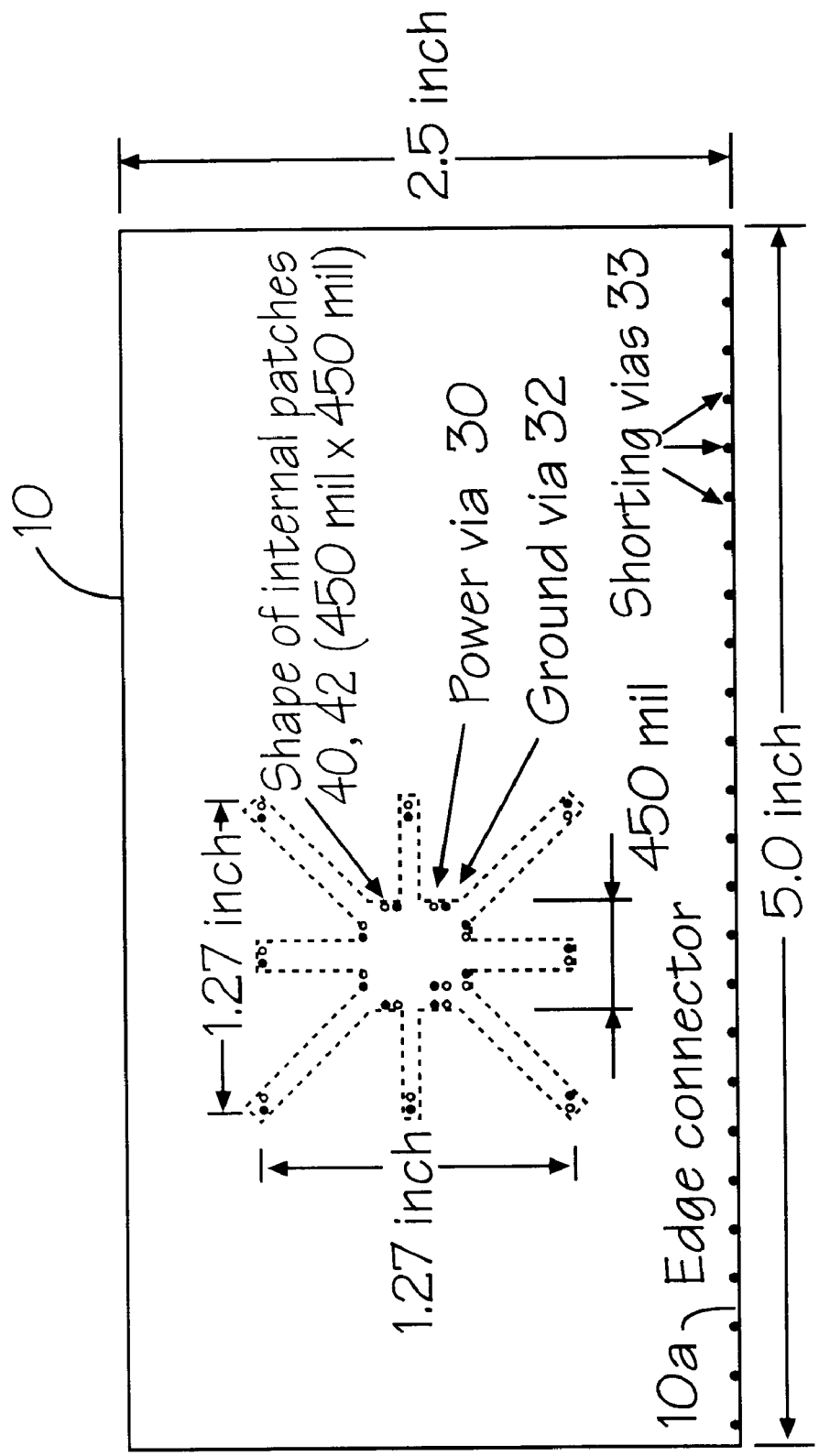
FIG. 3a is a schematic top view of a multi-level PCB, including a ground plane, a power plane, a first signal plane having a power patch and a second signal plane having a ground patch.
Figure 3B:
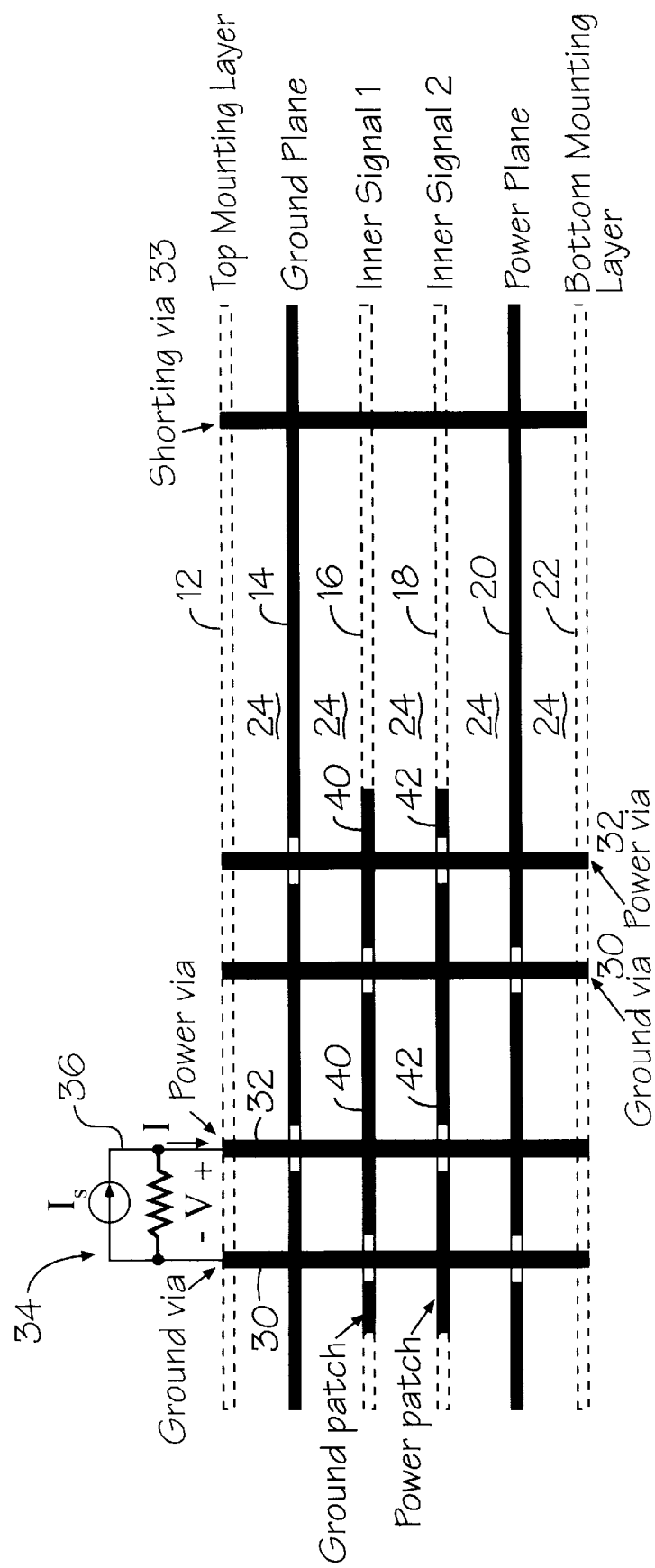

Referring now to FIGS. 3a and 3b, there is shown the multi-level PCB board 10 with vias 30, 32 and 33, as depicted in FIGS. 2a and 2b. An electrically isolated conductive portion or "patch" 40 is disposed, by suitable means well known in the art, in Inner Signal 1 plane 16 and connected, by means of power vias 32, to power plane 20. Similarly, a patch 42 is disposed in Inner Signal 2 plane 18 and connected, by means of ground vias 30, to ground plane 14. Patches 40 and 42 are 450×450 mils. Patches 40 and 42 are generally solid, but a mesh-like structure can also be used, with interruptions through vias. The internal portion of the power and ground patches are stretched out to an area 1.27 inch by 1.27 inch in size.

Figure 4A:
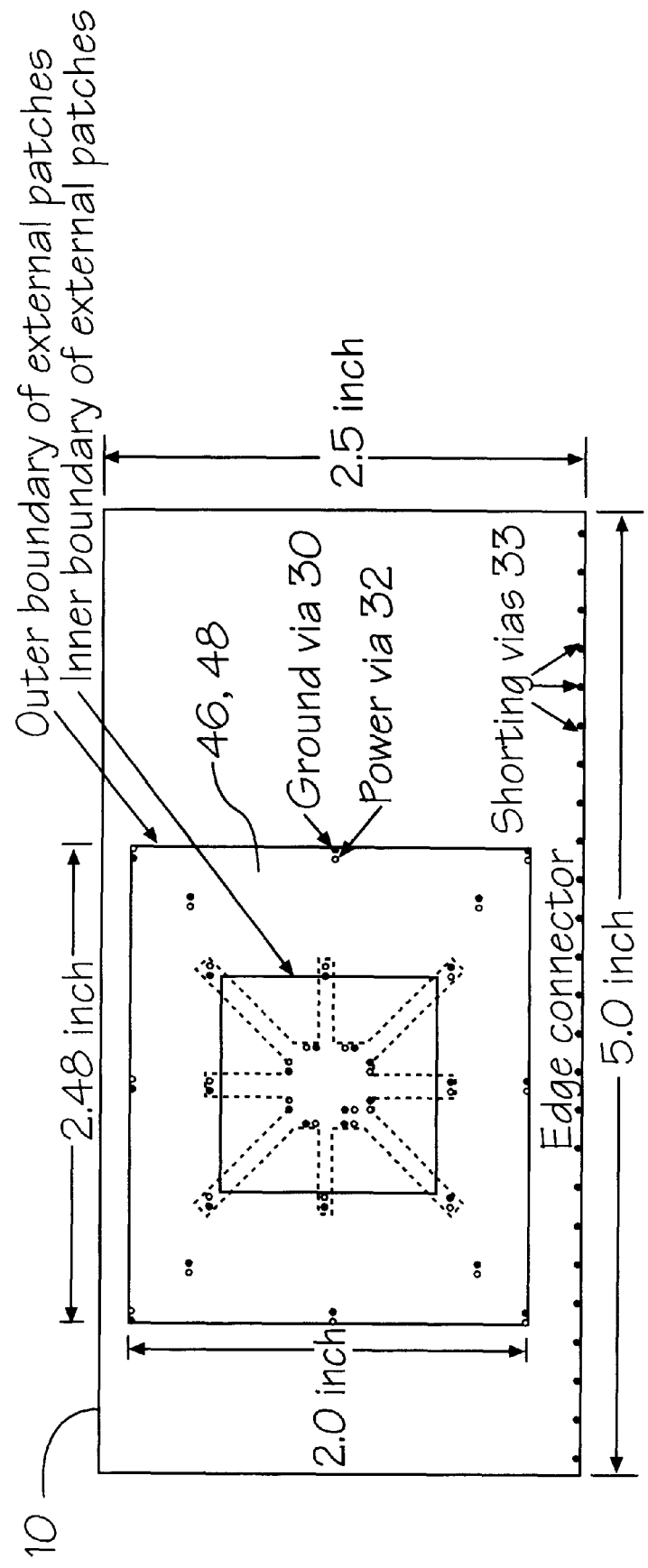
FIG. 4a is a schematic top view of a multi-level PCB, such as shown in FIG. 3a, with the addition of external power and ground patches disposed, respectively, on the top and bottom mounting layer thereof.
Figure 4B:
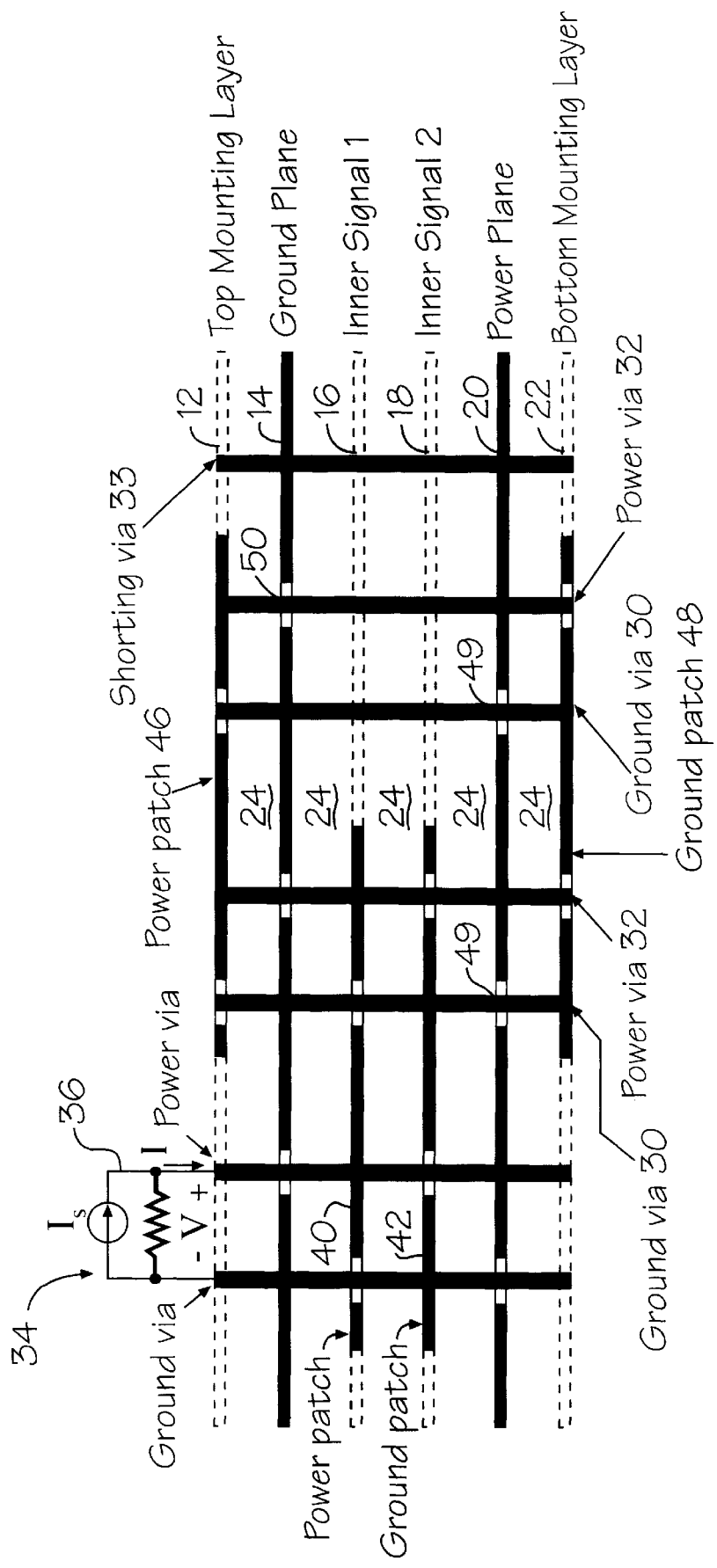

Referring now to FIGS. 4a and 4b, there is shown the multi-level PCB board 10 with vias 30, 32 and 33 and patches 40 and 42 in Inner Signal 1 and Inner Signal 2 planes, 16 and 18, respectively, as depicted in FIGS. 3A and 3B. An additional power patch 46 is disposed in top signal mounting layer or plane 12, making it an external patch. Similarly, an additional ground patch 48 is disposed in bottom signal mounting layer or plane 22, also making it an external patch. External patches 46 and 48 are 2.48"×2.0" with a square hole of 1.1"×1.1".

As can be seen in FIG. 4b, the top mounting plane external power patch 46 is connected to power plane 20 and internal power patch 40; and the bottom mounting plane external ground patch 48 is connected to ground plane 14 and internal ground patch 42. Ground patch 48 is not connected to power plane 20 as shown at reference numeral 49, nor is power patch 46 connected to ground plane 14, as shown at reference numeral 50.

Figure 5A:
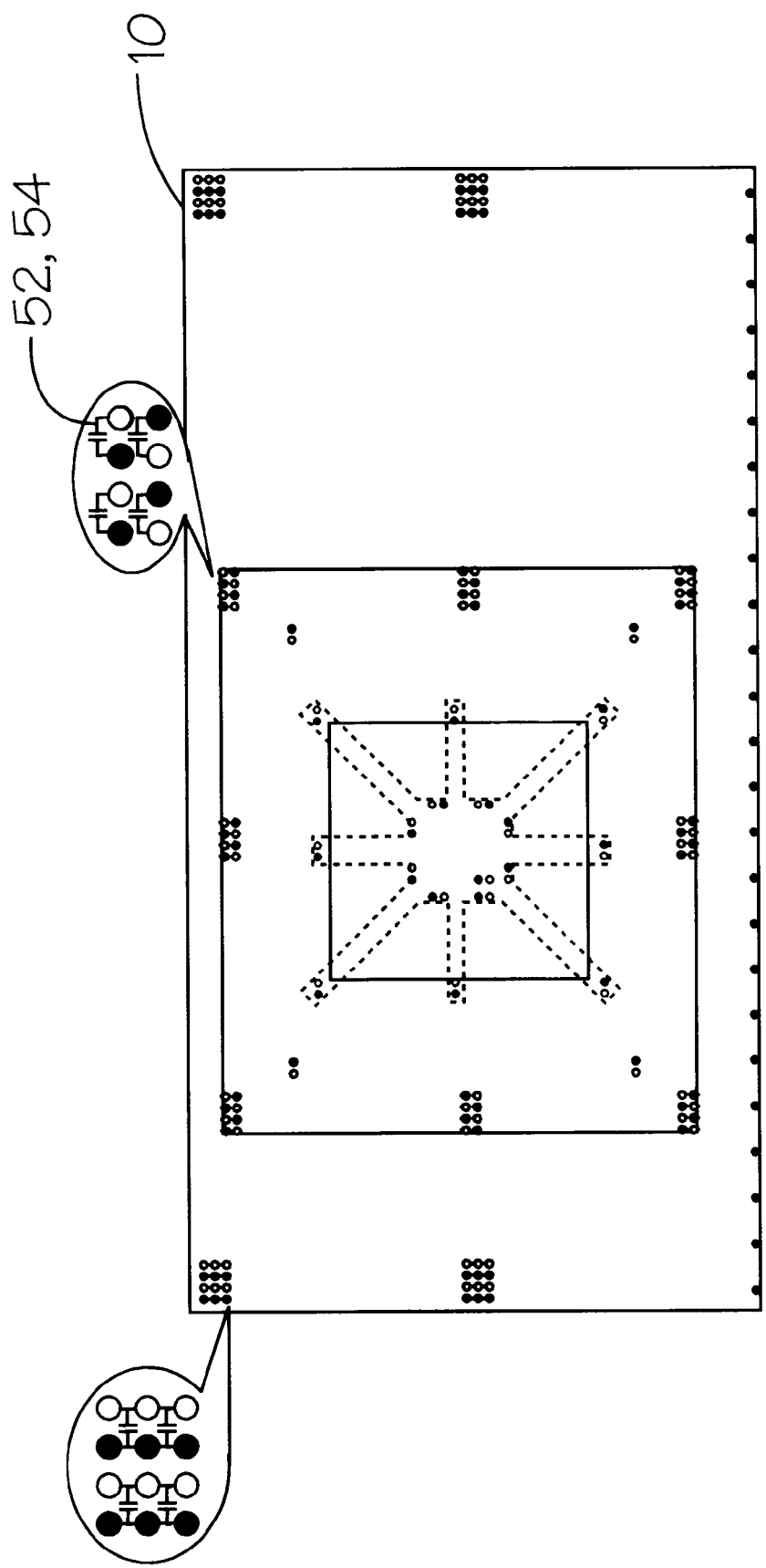
FIG. 5a is a schematic top view of a multi-level PCB, such as shown in FIG. 4a, with decoupling capacitors connected between the power plane and power patch and the ground plane and ground patch.
Figure 5B:
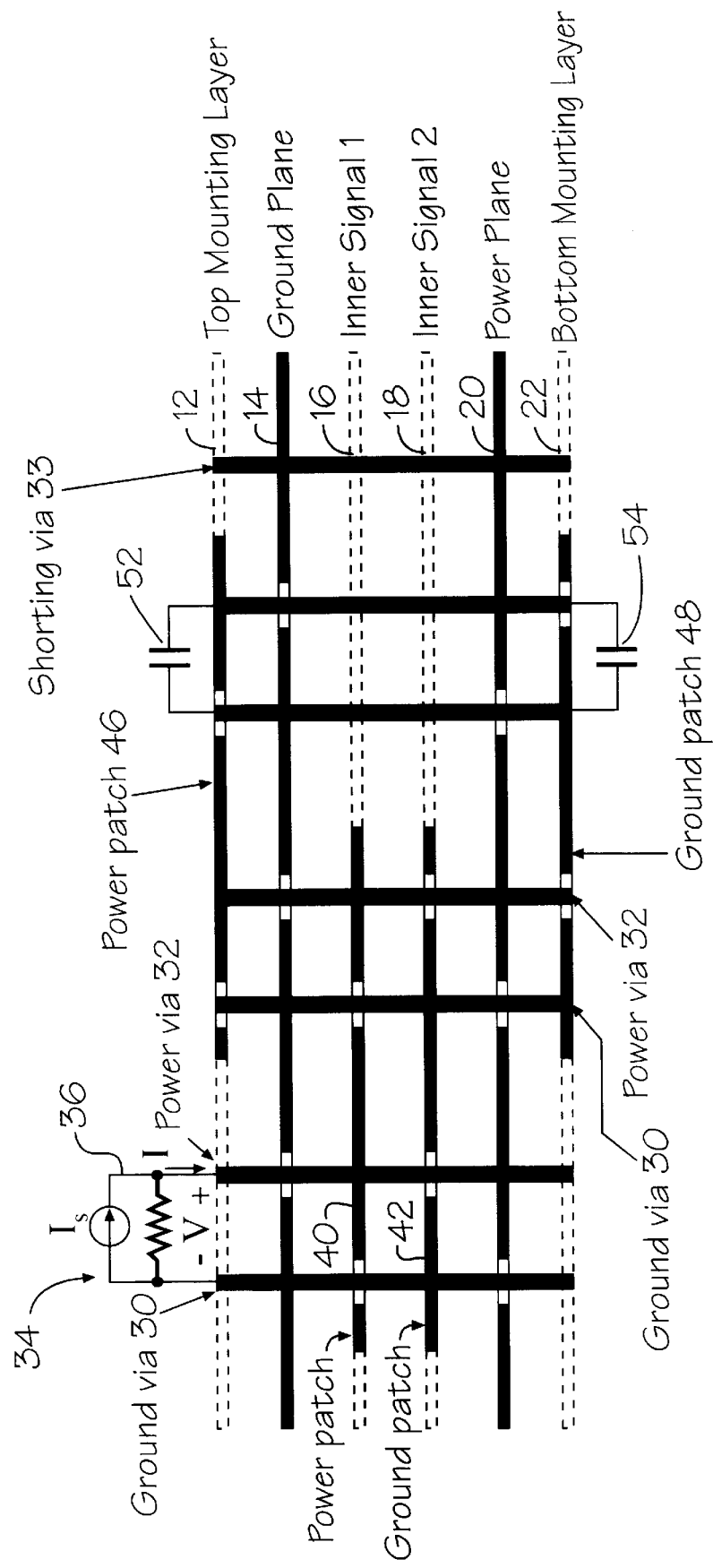

Referring now to FIGS. 5a and 5b, there is shown the multi-level PCB board 10, generally as depicted in FIGS. 4a and 4b. A decoupling capacitor 52 is connected between ground via 30 and power via 32. Similarly, another decoupling capacitor 54 is connected between power via 32 and ground via 30. The decoupling capacitors 52 and 54 are both 47 nF, effective series inductance of 0.9 nH, and effective series resistance of 844 mOhm.

Figure 6:
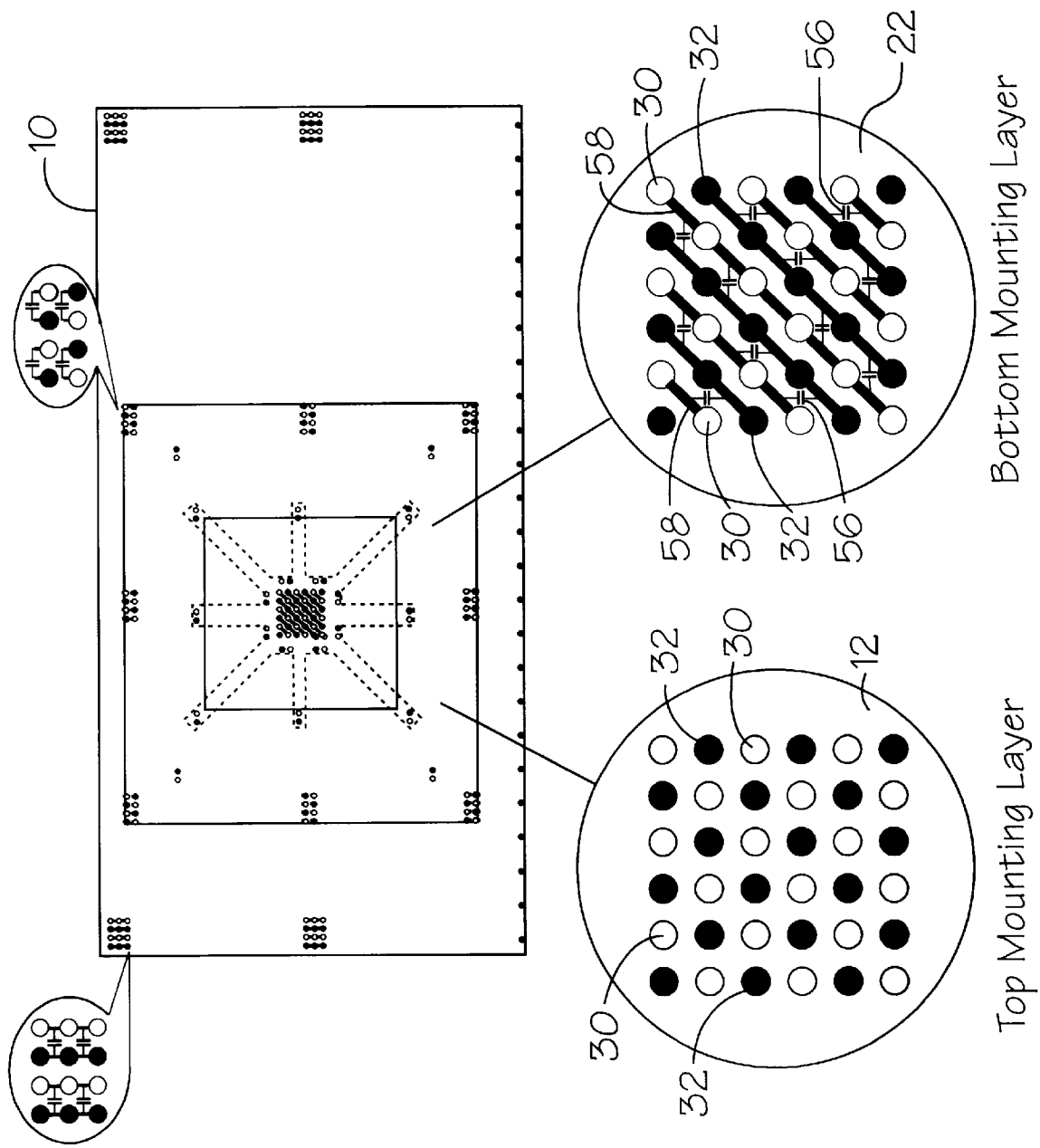
FIG. 6 is an exploded, schematic top view, in the center region of the internal power and ground patches, of the power and ground through hole vias, and the connections of decoupling capacitors on the bottom mounting layer.

Referring now to FIG. 6, there is shown an exploded, schematic view of the top mounting signal layer 12 and the bottom mounting signal layer 22, with respective power vias 32 and ground vias 30 formed in a 6×6 array. Connecting power and ground vias 32 and 30, respectively, to each other are connecting trace strips 58, oriented 45°. The width of these trace strips 58 is 30 mils. On the bottom mounting layer 22, decoupling capacitors 56 are connected between trace strips 58.

Computation of the simulated input impedance and the simulated effective inductance of the multi-layer PCB board 10 was performed by connecting a circuit 34 across ground and power vias 30 and 32, with and without decoupling capacitors 52, 54 and 56 on the board 10, as described in greater detail hereinbelow.

Figure 7:
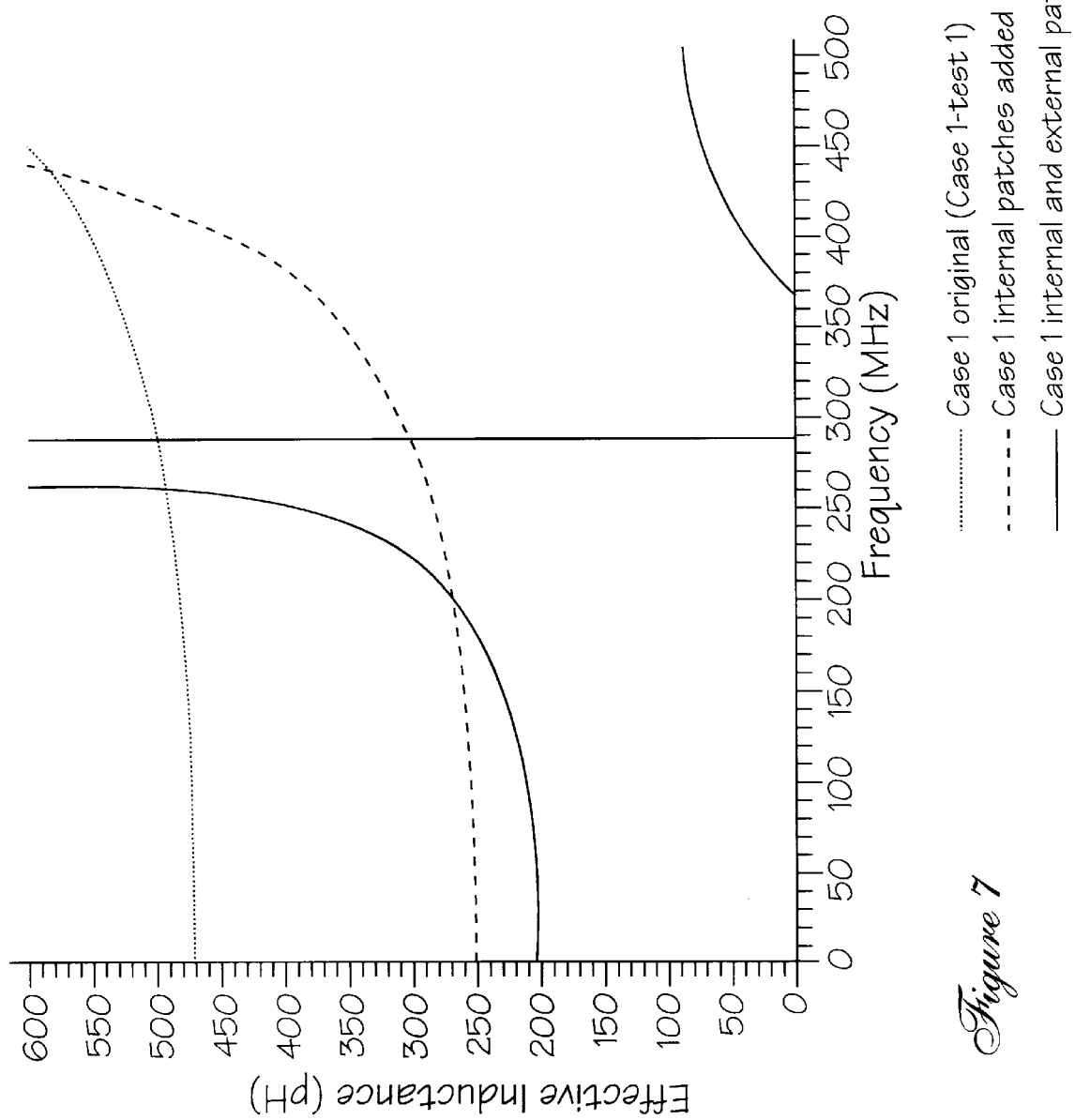

Referring now to FIG. 7, there is shown a graph of effective inductance vs. frequency of the structure 10 shown in FIGS. 2a, 3a and 4a. The effective inductance shown is between the pair of power and ground plated through hole vias located near the center region of the internal patches on the top mounting layer. At the low frequency range, and without either internal or external patches, the structure 10 has an effective inductance of about 470 pH. After adding the two internal patches 40 and 42 to signal planes 16 and 18, respectively, the effective inductance is reduced to 248 pH, which represents a 47% reduction from that of the original structure 10. After adding both internal patches 40 and 42 and external patches 46 and 48, the effective inductance is further reduced to 204 pH. However, after adding internal and external patches 40, 42 and 46, 48, the resonant frequency of the board 10 becomes lower. The effective inductance increases dramatically as the frequency increases and approaches the resonant frequency.

Figure 8:
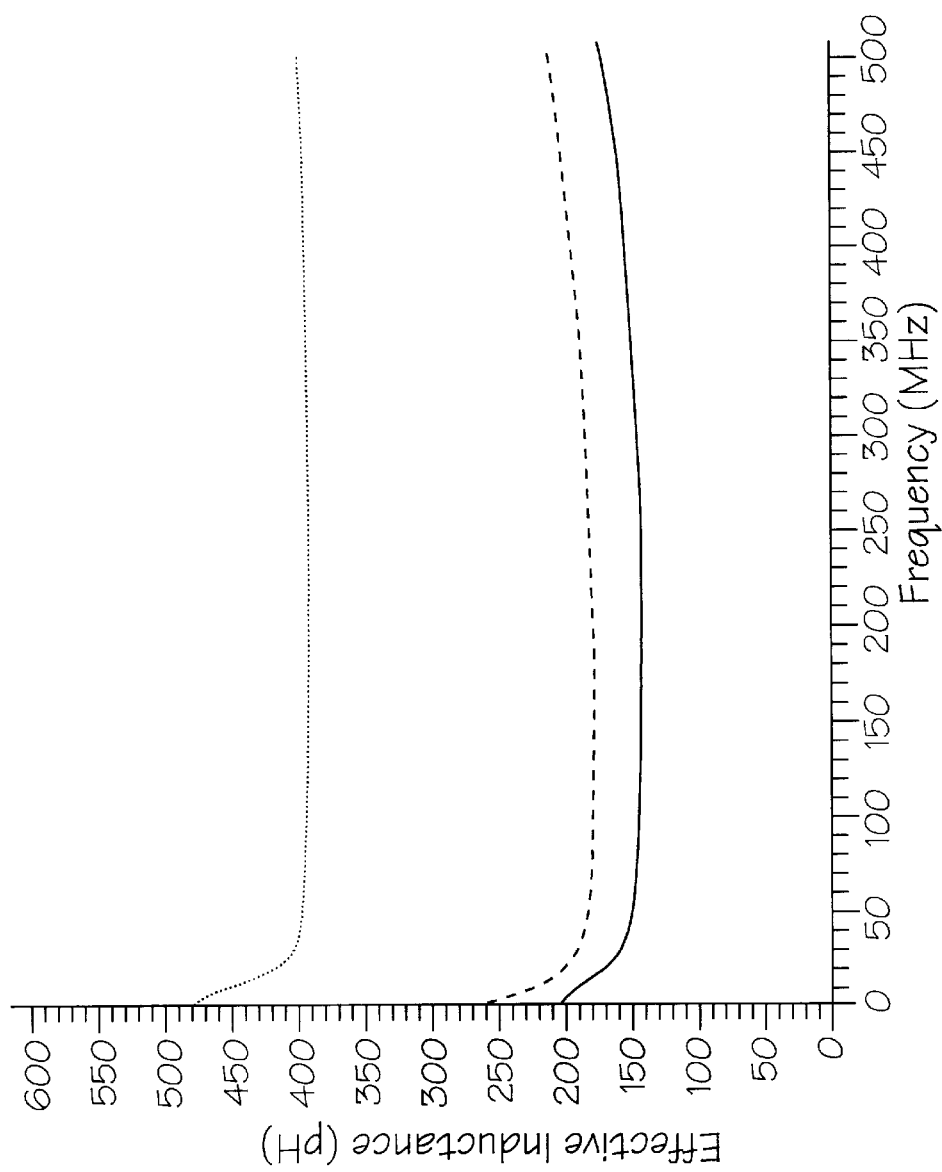

Referring now to FIG. 8, there is shown a graph of effective inductance vs. frequency of the structure 10 shown in FIG. 5a. The effective inductance shown is between the pair of power and ground plated through hole vias located near the center region of the internal patches on the top mounting layer. When decoupling capacitors 52 and 54 are added along the peripheral boundary of the board 10 and external patches 46 and 48, the resonant frequencies of the board 10 are effectively moved upwards and above 500 MHz. At 200 MHz, the effective inductance of the original structure 10 without either internal or external patches is 399 pH. The effective inductance after adding the internal patches 40 and 42 is 185 pH, which represents a 54% reduction from that of the original structure 10. After adding both internal patches 40 and 42 and external patches 46 and 48, the effective inductance is further reduced to 148 pH, which represents a 63% reduction from that of the original structure 10.

Figure 9:
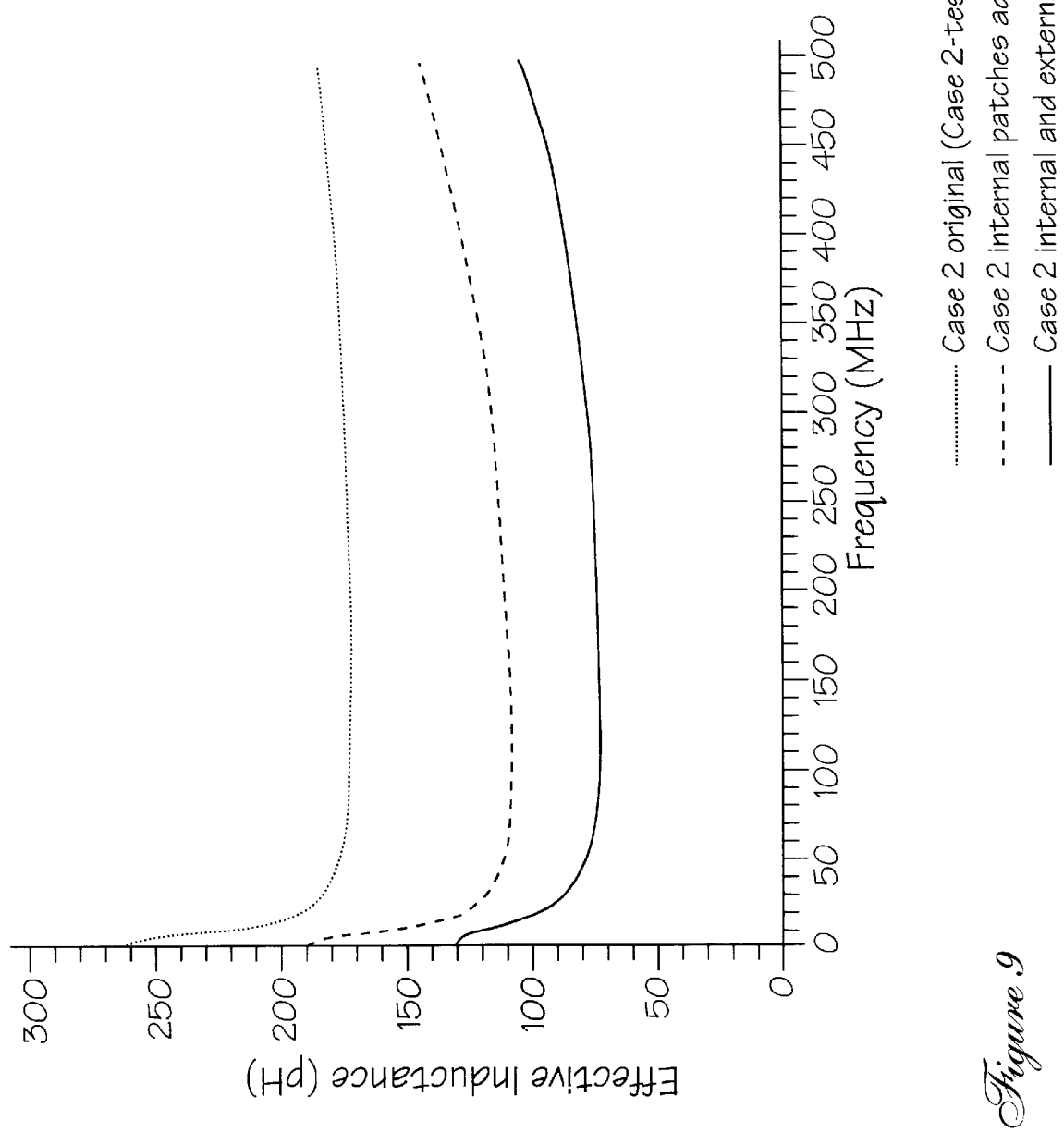
FIG. 9 is a graphical representation of the effective inductance vs. frequency for the structure shown in FIG. 6 but without the twelve decoupling capacitors in the core area shown in FIG. 6.

Referring now to FIG. 9, there is shown a graph of effective inductance vs. frequency of the structure 10 shown in FIG. 6 but without twelve decoupling capacitors in the core area. The effective inductances are measured between 18 power vias 32 and 18 ground vias 30, located in the core area on the top mounting signal layer 12. Decoupling capacitors 52 and 54 are included along the peripheral boundary of the board 10 and the external patches 46 and 48. The effects of internal patches 40 and 42 and external patches 46 and 48 in the reduction of effective inductance are apparent from the graph in FIG. 9.

Figure 10:
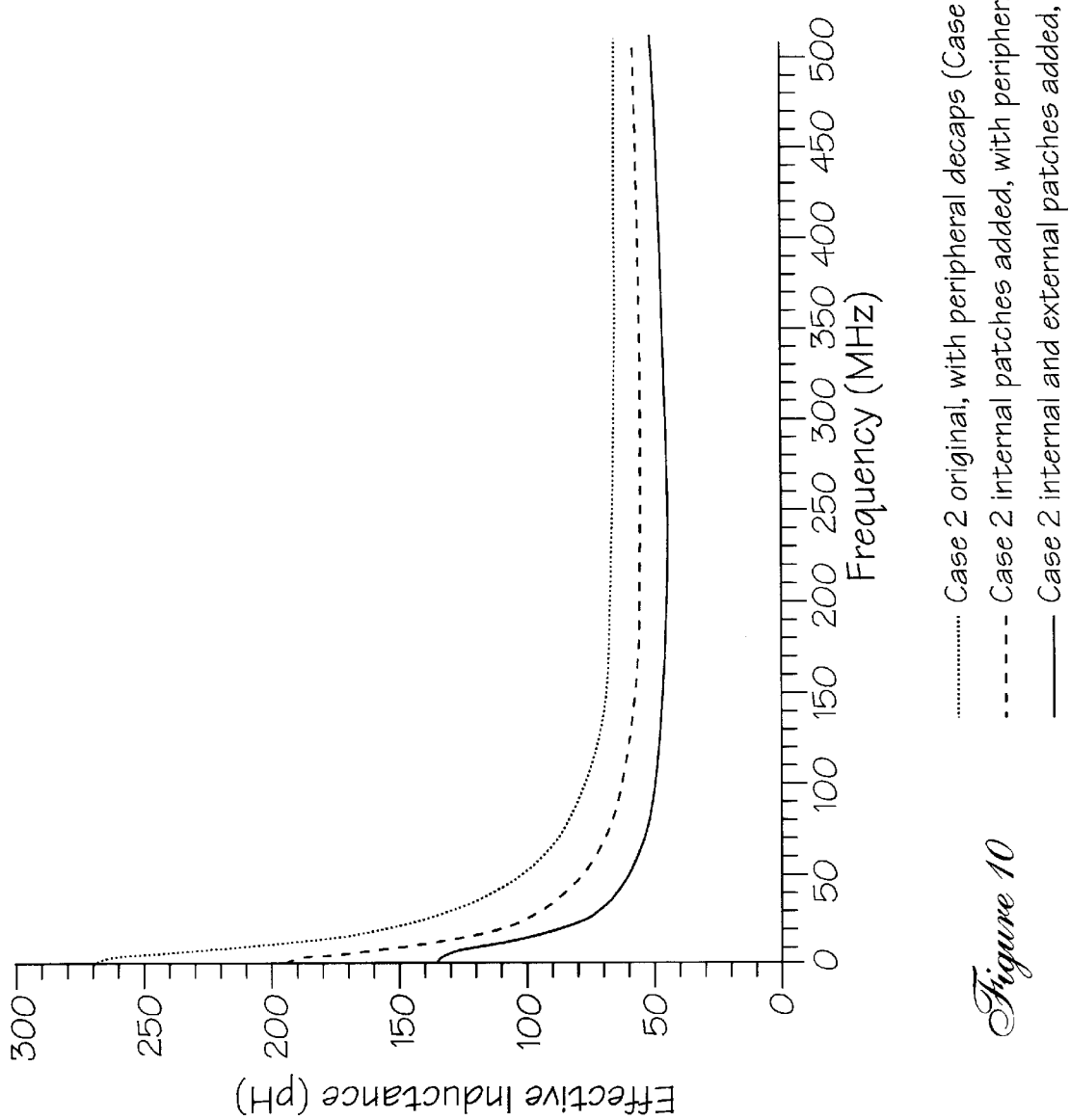
FIG. 10 is a graphical representation of the effective inductance vs. frequency for the structure shown in FIG. 6.

Referring now to FIG. 10, there is shown a graph of effective inductance vs. frequency of the structure 10 shown in FIG. 6. The effective inductance shown is between 18 power and 18 ground plated through hole vias located in the center region of the internal patches on the top mounting layer. When twelve decoupling capacitors 56 are added in the core area of the chip in the bottom mounting signal layer 22, the effects of the decoupling capacitors 56 appear to be dominant in the core area. At 200 MHz, adding internal patches 40 and 42 and external patches 46 and 48 reduces the effective inductance by 17.3% to 33% from that of the structure 10 without patches.

Figure 11:
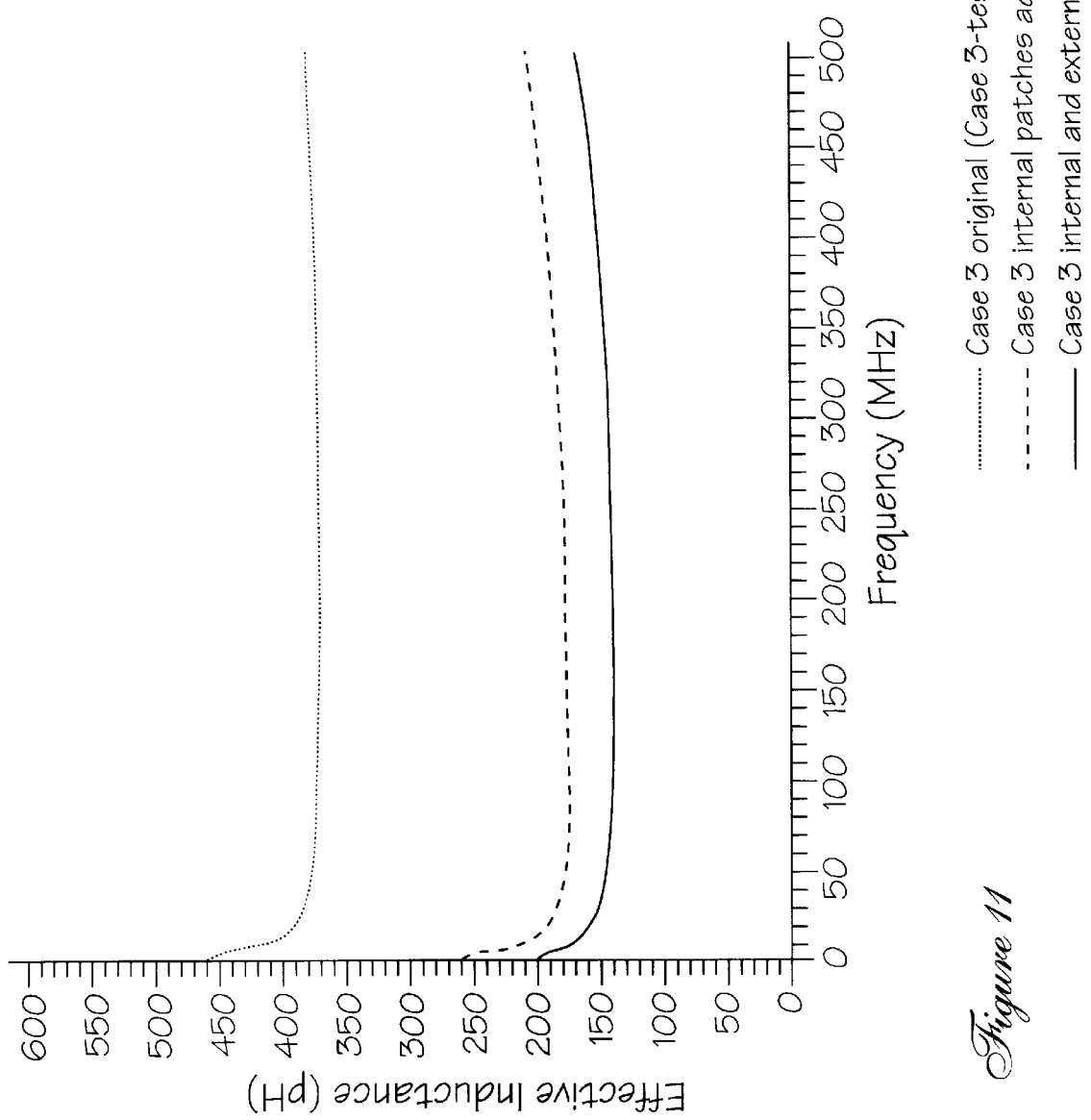
FIG. 11 is a graphical representation of the effective inductance vs. frequency for the structure shown in FIG. 6 but without twelve decoupling capacitors in the core area shown in FIG. 6. The effective inductances measured are between one pair of power and ground vias at the lower left corner of the 6×6 via array in the center region of patches.

Referring now to FIG. 11, there is shown a graph of effective inductance vs. frequency of the structure 10 shown in FIG. 6 but without twelve decoupling capacitors in the core area. The effective inductances are measured between one power via 32 and one ground via 30 at the lower left corner of the 6×6 via array in the core area of the chip. Decoupling capacitors 52 and 54 are included along the peripheral boundary of the board 10 and the external patches 46 and 48. No decoupling capacitors 56 are placed in the core area of the chip on the bottom mounting signal layer 22. It can be seen that the effects of patches 40, 42, 46 and 48 are very significant.

Figure 12:
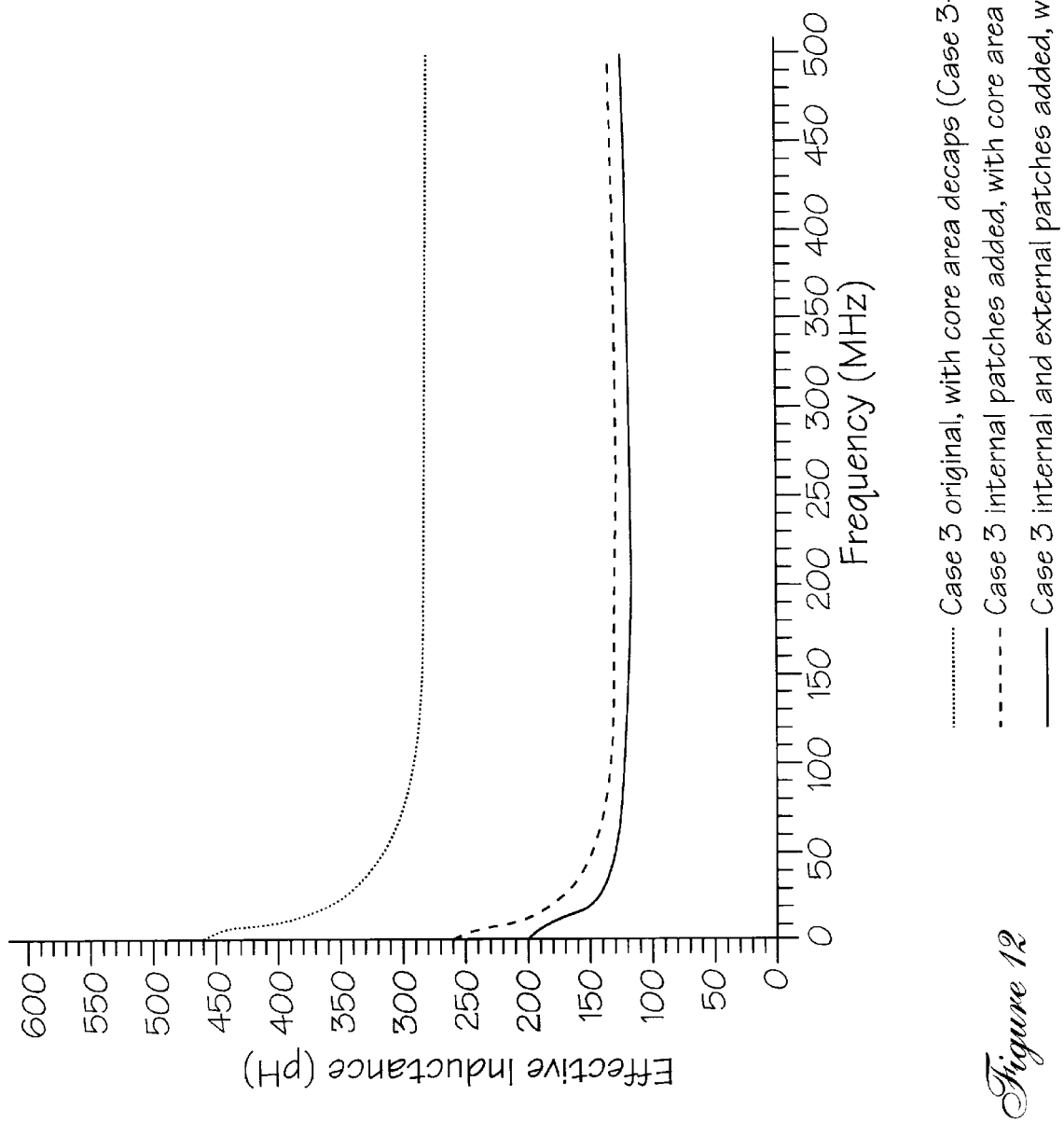
FIG. 12 is a graphical representation of the effective inductance vs. frequency for the structure shown in FIG. 6. The effective inductances measured are between one pair of power and ground vias at the lower left corner of the 6×6 via array in the center region of patches.

Referring now to FIG. 12, there is shown a graph of effective inductance vs. frequency of the structure 10 shown in FIG. 6. The effective inductances are measured between one power via 32 and one ground via 30 at the lower left corner of the 6×6 via array in the core area of the chip. Decoupling capacitors 52 and 54 are included along the peripheral boundary of the board 10 and the external patches 46 and 48. Twelve decoupling capacitors 56 are added in the core area of the chip in the bottom mounting signal layer 22. It can be seen that the effects of patches 40, 42, 46 and 48 are substantial.

Thus it can be seen that the inventive technique of providing patches, connected respectively to the power plane and to the ground plane, is a valuable process for reducing effective inductance and input impedance. Moreover, decoupling capacitors are used to good advantage between the sets of plated through hole vias to further reduce input impedance and to move resonant frequencies of printed circuit board structures upwards.

Since other modifications and changes varied to fit particular operating requirements and environments will be apparent to those skilled in the art, the invention is not considered limited to the example chosen for purposes of disclosure, and covers all changes and modifications which do not constitute departures from the true spirit and scope of this invention.

Having thus described the invention, what is desired to be protected by Letters Patent is presented in the subsequently appended claims.

What is claimed is:

1. In a multi-level printed circuit board adapted for mounting an integrated circuit, said circuit board having an upper mounting surface and a lower mounting surface and containing two service planes, said service planes comprising at least a power plane and a ground plane spaced apart from said power plane, an improvement comprising a signal plane spaced apart from each of said two service planes, said signal plane comprising a signal trace for conducting an electrical signal from a first, predetermined point to a second, predetermined point thereon, said signal plane having an electrically conductive portion thereof electrically isolated from the signal traces on said signal plane, placed underneath substantially the entire area occupied by at least one integrated circuit chip mounted on said circuit board, and being operatively connected to one of said service planes, whereby effective inductance and input impedance of said power and ground planes is reduced.

2. The multi-level printed circuit board in accordance with claim 1, wherein said electrically conductive portion of said signal plane is connected at a plurality of locations thereon to at least one of said service planes.

3. The multi-level printed circuit board in accordance with claim 1, further comprising a plated through hole via for connecting at least one of said service planes to said electrically conductive portion of said signal plane.

4. The multi-level printed circuit board in accordance with claim 1, further comprising an external, electrically conductive plane disposed on at least one of said upper surface and said lower surface of said printed circuit board, a portion of said external plane being operatively connected to said electrically conductive portion of said signal plane and to at least one of said service planes.

5. In a multi-level printed circuit board having an upper mounting surface and a lower mounting surface and containing a power plane for conducting and distributing electrical power and a ground plane, spaced apart from said power plane, for providing and distributing an electrical ground, an improvement comprising a signal plane, spaced apart from said power plane and spaced apart from said ground plane, for conducting and distributing electrical signals from a first predetermined point thereon to a second predetermined point thereon, said signal plane having an electrically conductive portion thereof electrically isolated from signal traces in the remainder of said signal plane, placed underneath substantially the entire area occupied by at least one integrated circuit chip mounted on said circuit board, and being operatively connected to one of said power plane and said ground plane, whereby effective inductance and input impedance of said power and ground planes is reduced.

6. The multi-level printed circuit board in accordance with claim 5, wherein said electrically conductive, electrically isolated portion of said signal plane is connected at a plurality of locations thereon to at least one of said ground plane and said power plane.

7. The multi-level printed circuit board in accordance with claim 5, further comprising a first plated through hole via for connecting said at least one of said ground plane and said power plane to said electrically conductive, electrically isolated portion of said signal plane.

8. The multi-level printed circuit board in accordance with claim 5, further comprising an external, electrically conductive plane disposed on said upper mounting surface of said printed circuit board, a portion of said external plane being operatively connected to said electrically conductive, electrically isolated portion of said signal plane and to said at least one of said ground plane and said power plane.

9. The multi-level printed circuit board in accordance with claim 5, said signal plane further comprising another electrically conductive portion thereof electrically isolated from signal traces in the remainder of said signal plane and being operatively connected to said at least one of said ground plane and said power plane.

10. The multi-level printed circuit board in accordance with claim 9, further comprising a first plated through hole via for connecting said at least one of said ground plane and said power plane to said another electrically conductive, electrically isolated portion of said signal plane and a second plated through hole via for connecting said at least one of said ground plane and said power plane to said other essentially solid, electrically conductive, electrically isolated portion of said signal plane.

11. The multi-level printed circuit board in accordance with claim 10, further comprising a decoupling capacitor operatively connected between said first plated through hole via and said second plated through hole via.

12. The multi-level printed circuit board in accordance with claim 7, said printed circuit board further comprising a second signal plane having a portion thereof electrically isolated from signal traces in the remainder of said second signal plane and being operatively connected to said ground plane.

13. The multi-level printed circuit board in accordance with claim 5, further comprising a second signal plane having a portion thereof electrically isolated from signal traces in the remainder of said second signal plane and being operatively connected to said power plane.

14. The multi-level printed circuit board in accordance with claim 13, further comprising a first plated through hole via for connecting said ground plane to said electrically isolated portion of said signal plane and a second plated through hole via for connecting said power plane to said electrically isolated portion of said second signal plane.

15. The multi-level printed circuit board in accordance with claim 14, further comprising a decoupling capacitor operatively connected between said first plated through hole via and said second plated through hole via.

16. In a multi-level printed circuit board having an upper mounting surface and a lower mounting surface and containing at least two service planes, said service planes comprising a power plane and a ground plane spaced apart from said power plane, the improvement comprising at least one signal plane spaced apart from each of said two service planes, said signal plane comprising a signal trace for conducting an electrical signal from a first, predetermined point to a second, predetermined point thereon, said signal plane having an electrically conductive patch electrically isolated from signal traces in the remainder of said signal planes and being operatively connected to one of said two service planes, whereby effective inductance and input impedance of said power and ground planes are reduced.

17. The printed circuit board as recited in claim 16, wherein said printed circuit board is adapted to support an integrated circuit chip on said upper mounting surface, a portion of said patch being located directly beneath said integrated circuit chip.

18. The printed circuit board as recited in claim 17, wherein said integrated circuit comprises a core region and said portion of said patch is located directly beneath said core region.

19. A method for reducing effective inductance and input impedance of the power and ground planes of a printed circuit board supporting an integrated circuit chip, the steps comprising:
   a) providing a printed circuit board comprising at least one signal plane, a signal trace, at least one power plane, and at least one ground plane;
   b) rerouting said signal traces on said signal plane away from areas proximate said integrated circuit chip, thereby creating at least one cleared area;
   c) providing at least one electrically conductive patch in said at least one cleared area, said patch being electrically isolated from signal traces in the remainder of said signal plane; and
   d) selectively connecting said patch to at least one of said at least one ground plane and said at least one power plane in said printed circuit board whereby the input impedance and effective inductance of said power and ground planes are effectively reduced.

20. The printed circuit board as recited in claim 19, wherein said integrated circuit comprises a core region and said rerouting step (b) comprises rerouting said signal traces on said signal plane away from areas proximate said core region.

* * * * *